United States Patent
Niwa (12) 
(10) Patent No.: US 6,355,947 B1
(45) Date of Patent: Mar. 12, 2002

(54) HETEROJUNCTION BIPOLAR TRANSISTOR WITH BAND GAP GRADED EMITTER

(75) Inventor: Takaki Niwa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/357,821

(22) Filed: Jul. 21, 1999

(30) Foreign Application Priority Data

Aug. 20, 1998 (JP) .......................................... 10-234651

(51) Int. Cl.$^7$ ...................... H01L 31/288; H01L 31/304
(52) U.S. Cl. ........................ 257/197; 257/198; 257/199; 257/200; 257/201
(58) Field of Search ................................ 257/197–201

(56) References Cited

U.S. PATENT DOCUMENTS 5,561,306 A * 10/1996 Kurata et al. ................ 257/197
5,724,193 A *  3/1998 Bayraktaraglu et al. .... 257/579
5,767,540 A *  6/1998 Shimizu ...................... 257/197

FOREIGN PATENT DOCUMENTS

| JP | 2-256243 | 10/1990 |
| JP | 2-27153 | 11/1990 |
| JP | 3-218675 | 9/1991 |
| JP | 5-36713 | 2/1993 |
| JP | 5-243256 | 9/1993 |
| JP | 6-232148 | 8/1994 |
| JP | 8-293505 | 11/1996 |
| JP | 10-098052 | 4/1998 |
| JP | 11-186281 | 7/1999 |

OTHER PUBLICATIONS

Madelung, Otfried (Ed), "Semiconductors–Basic Data" 1996, Springer, 2nd Ed., pp. 101, 151.*

TuP 24, Digest Book of International Electron Device Meeting 1997, p. 361. "High Performance InGap/GaAs HBTs with AlGa/InGaP Emitter Passivated Ledges for Reliable Power Applications".

* cited by examiner

Primary Examiner—Minh Loan Tran
Assistant Examiner—Thomas L Dickey
(74) Attorney, Agent, or Firm—McGinn & Gibb, PLLC (57) ABSTRACT

A heterojunction bipolar transistor having reduced parasitic emitter resistance. The bipolar transistor comprises a semi-insulating substrate, a collector contact layer formed on the semi-insulating substrate, a collector layer formed on the collector contact layer, a base layer formed on the collector layer, an emitter layer formed on the base layer, a composition graded layer formed on the emitter layer, and an emitter contact layer formed on the composition graded layer. A forbidden band width of the emitter layer is wider than that of the base layer. A forbidden band width of the emitter contact layer is narrower than that of the emitter layer and impurity concentration of the emitter contact layer is higher than that of the emitter layer. Composition of the composition graded layer is inclined so as to avoid discontinuity of conduction band or valence band at the interface between the composition graded layer and the emitter layer and at the interface between the composition graded layer and the emitter contact layer, and impurity concentration of the composition graded layer is higher than that of the emitter layer.

12 Claims, 6 Drawing Sheets

PRIOR ART

PRIOR ART

FIG. 11

PRIOR ART

FIG. 12

PRIOR ART

HETEROJUNCTION BIPOLAR TRANSISTOR WITH BAND GAP GRADED EMITTER

FIELD OF THE INVENTION

The present invention relates generally to a bipolar transistor and a method of manufacturing the bipolar transistor, and more particularly to a heterojunction bipolar transistor (HBT) in which parasitic emitter resistance is effectively reduced.

BACKGROUND OF THE INVENTION

Conventionally, in order to reduce emitter resistance of a heterojunction bipolar transistor, there is known a method in which a composition graded layer, i.e., a layer in which the composition is graded, sloped or inclined is inserted between an emitter cap layer and an emitter layer, and thereby an increase in the emitter resistance caused by the discontinuity of a conduction band is suppressed. Such method is described, for example, in a thesis "High Performance InGaP/GaAs HBTs with AlGaAs/InGaP Emitter Passivated Ledges for Reliable Power Applications", TuP24, Digest Book of International Electron Device Meeting 1997, page 361.

An explanation will be made in detail on a structure of a conventional HBT which uses an InGaP layer as an emitter layer and which adopts the above-mentioned method to reduce emitter resistance.

Figure 9:
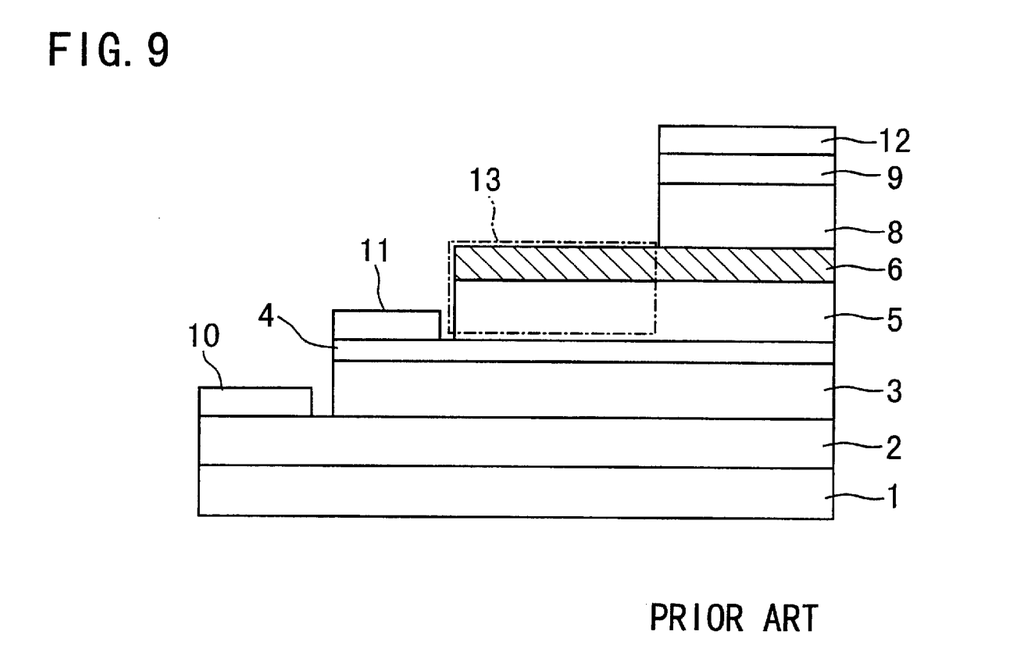
FIG. 9 is a cross sectional view illustrating an example of a layer structure of a conventional heteojunction bipolar transistor.
Figure 10:
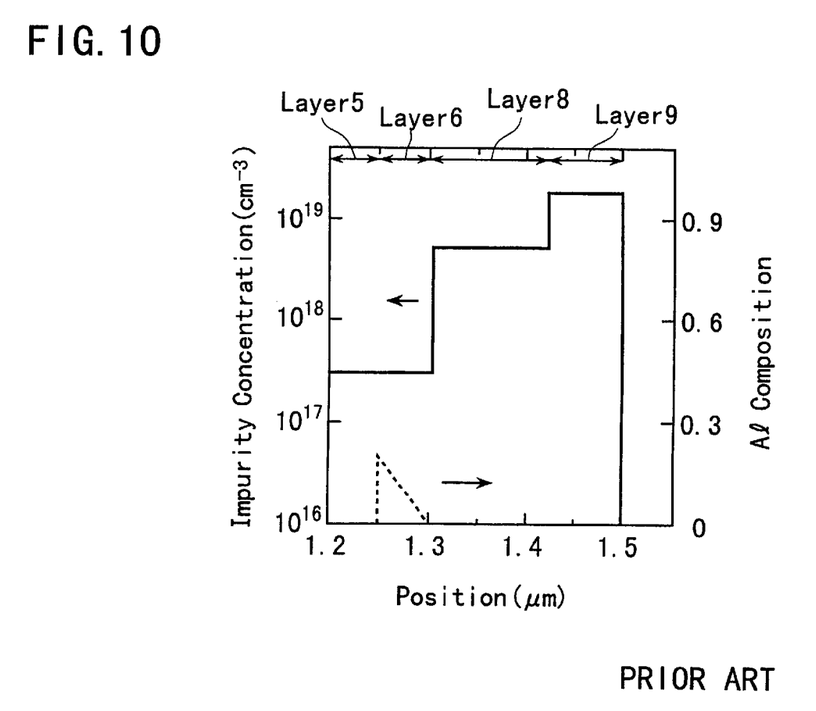
FIG. 10 is a graph showing a distribution of impurity concentration and a distribution of Al composition in the conventional heterojunction bipolar transistor shown in FIG. 9.

FIG. 9 is a sectional view illustrating an example of a epitaxial layer structure of a conventional HBT which uses an InGaP emitter layer. In the structure of FIG. 9, n type GaAs subcollector layer 2, n type GaAs collector layer 3, and p type InGaAs composition graded base layer 4 are sequentially formed or laminated on a semi-insulating GaAs substrate 1 which is hereafter referred to also as a semi-insulating substrate. The n type GaAs subcollector layer 2 is hereafter referred to also as an n type collector contact layer, and the n type GaAs collector layer 3 is hereafter referred to also as an n type collector layer. The p type InGaAs composition graded layer 4 is referred to also as a "base layer 4" or a "layer 4" hereafter. On a part of the n type GaAs subcollector layer 2 and on a part of the base layer 4, a collector electrode 10 and a base electrode 11 are respectively formed by vapor deposition. On the base layer 4, an n type InGaP emitter layer 5 is formed. Hereafter, the n type InGaP emitter layer 5 is also referred to as an n type emitter layer 5, an emitter layer 5 or a layer 5. On the emitter layer 5, an n type AlGaAs composition graded layer 6, in which Al composition is graded, is formed. Hereafter, the n type AlGaAs composition graded layer 6 is referred to also as a layer 6. The impurity concentration of each of the layer 5 and the layer 6 is set to a low value to avoid increase in the base-emitter capacity, and is set to a value between $1 \times 10^{17}$ $cm^{-3}$ and $5 \times 10^{17}$ $cm^{-3}$. The layer 6 is provided to avoid occurrence of discontinuity of the conduction band between the n type InGaP emitter layer 5 and an n type GaAs cap layer 8, stacked on the layer 6, and thereby to suppress increase in the emitter resistance. Hereafter, the n type GaAs cap layer 8 is also referred to as the "layer 8". An n type composition graded InGaAs contact layer 9 which is stacked on the layer 8 and which is hereafter referred to also as "layer 9" is used to decrease contact resistance between an emitter electrode 12 stacked on the layer 9 and the layer 8. Both the layer 8 and the layer 9 are set to have a high impurity concentration equal to or larger than $1 \times 10^{18}$ $cm^{-3}$ to decrease resistance thereof. FIG. 10 shows a distribution of impurity concentration and a distribution of Al composition from the layer 5 to the layer 9 in the conventional heterojunction bipolar transistor shown in FIG. 9.

A hetero guard ring portion 13 is provided to protect the surface of the base layer 4 between the base electrode 11 and the emitter electrode 12. By providing the hetero guard ring 13, it becomes possible to greatly decrease the surface recombination current at the surface of the base layer 4. The hetero guard ring portion 13 can be formed, after etching the layer 9, by selectively etching the layer 8 by means of selective dry etching of AlGaAs/GaAs and by leaving the layer 6. It is necessary that the hetero guard ring portion 13 is completely depleted. Therefore, when, for example, the total thickness of the layer 5 and the layer 6 is 60 nm, it is necessary that the impurity concentration of layer 6 as well as the layer 5 is set to at most a value equal to or lower than $5 \times 10^{17}$ $cm^{-3}$.

Now, explanation will be made as to the reasons why the emitter resistance, i.e., the resistance from the interface between the layer 5 and the base layer 4 to the emitter electrode 12, is high in the above-mentioned prior art HBT structure.

In the HBT structure shown in FIG. 9, a composition graded layer is used and, therefore, potential barrier caused by the discontinuity of conduction band does not occur. However, the emitter resistance becomes large by the reasons mentioned below.

Figure 11:
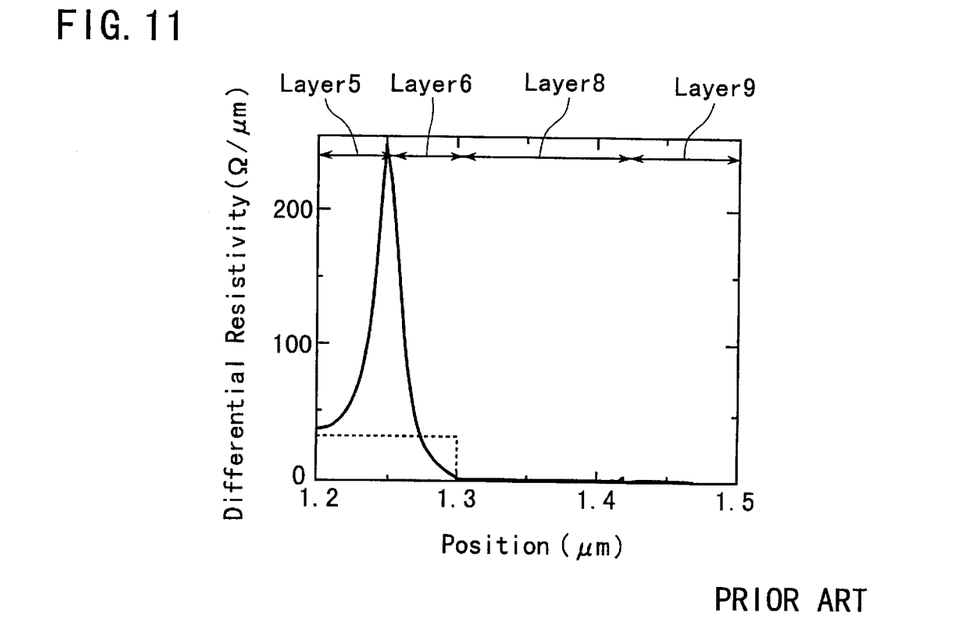
FIG. 11 is a graph showing a distribution of differential resistivity in the conventional heterojunction bipolar transistor shown in FIG. 9.

In FIG. 11, a solid line shows a characteristic of a differential resistivity of an emitter from the layer 5 to the layer 9 in the conventional HBT. The ordinate designates differential resistivity in ohm/micrometer, and the abscissa designates distance or position between the layer 5 and the layer 9 in micrometer. The area of the emitter is 10 square micrometers. The differential resistivity r(x) is represented by the expression (1) below. In the graph of FIG. 11, the area of a portion surrounded by the curve the differential resistivity r(x) and the abscissa becomes equal to the emitter resistance Re.

$$Re = \int r(x)dx \quad (1)$$

In FIG. 11, the dotted line shows a characteristic of a differential resistivity of a bulk calculated from the sheet resistances of the layer 5 and the layer 6. In the graph of FIG. 11, when the area surrounded by the solid line and the abscissa, that is, the emitter resistance, is compared with the area surrounded by the dotted line and the abscissa, that is, the bulk resistance, it can be seen that the emitter resistance becomes higher than the bulk resistance in the vicinity of the n type AlGaAs composition graded layer 6.

The reason why the differential resistivity becomes higher from the layer 6 toward the layer 5 is as follows. Since, in the layer 6, electron affinity varies with the gradient of composition, charge transfer occurs in the layer 6 and electron concentration reduces locally in the vicinity of the interface between the layer 6 and the layer 5.

Figure 12:
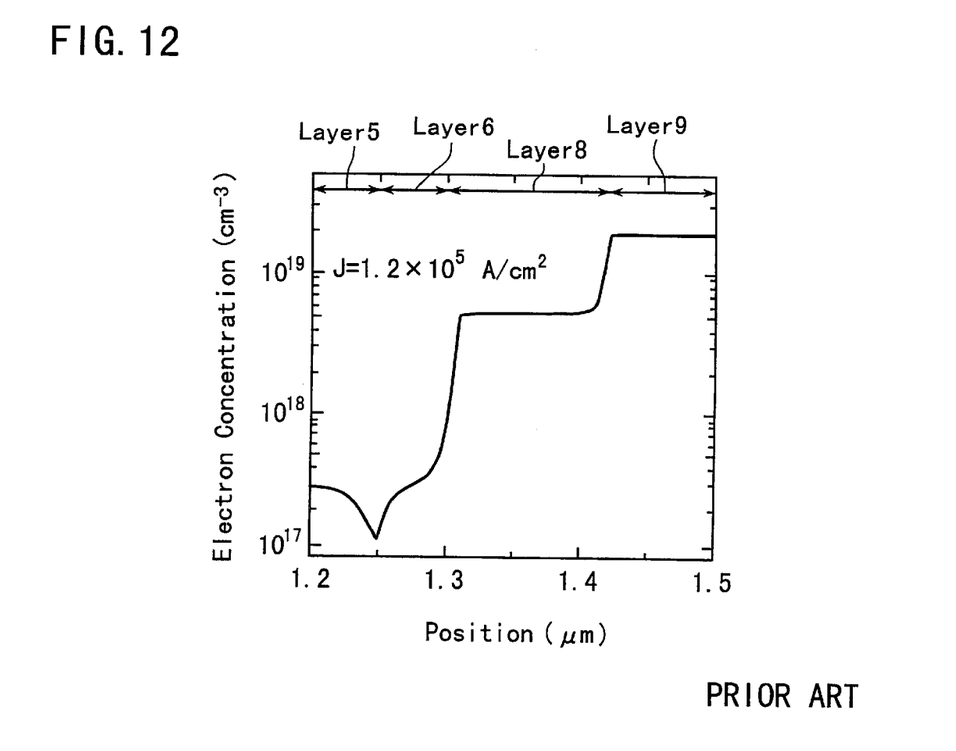
FIG. 12 is a graph showing a distribution of electron concentration in the conventional heterojunction bipolar transistor shown in FIG. 9.

FIG. 12 shows a distribution of electron concentration from the layer 5 to the layer 9 of the conventional HBT. From FIG. 12, it can be seen that electron concentration becomes high on the side of the layer 8 in the layer 6, and on the other hand electron concentration reduces in the vicinity of the interface between the layer 6 and the layer 5.

In the conventional structure shown in FIG. 9, there is a disadvantage in that the emitter resistance, that is, a resistance from the interface between the layer 5 and the base layer 4 to the emitter electrode 12, is considerably higher than the sum of bulk resistance calculated from the sheet resistance from the layer 5 to the layer 9 constituting an emitter and contact resistance between the electrode 12 and the layer 9. This is because, in the n type AlGaAs composition graded layer 6, electron affinity decreases according to the increase in Al composition toward the n type InGaP emitter layer 5. Due to such decrease in electron affinity, electron concentration within the layer 6 greatly decreases toward the n type InGaP emitter layer 5, and, due to the decrease in the electron concentration, a high resistance portion is produced in the vicinity of the interface between the layer 6 and the layer 5.

SUMMARY OF THE INVENTION

It is a main object of the present invention to provide a heterojunction bipolar transistor whose emitter resistance is made lower than that of a conventional heterojunction bipolar transistor.

It is another object of the present invention to provide an epitaxial structure for a heterojunction bipolar transistor in which a hetero guard ring for protecting surface of a base layer between an emitter electrode and a base electrode can be easily formed.

According to an aspect of the present invention, there is provided a bipolar transistor comprising: a semi-insulating substrate; a collector contact layer formed on the semi insulating substrate and having a first conductivity type; a collector layer formed on the collector contact layer and having the first conductivity type; a base layer formed on the collector layer and having a second conductivity type which is different from the first conductivity type; and an emitter layer formed on the base layer and having the first conductivity type. A forbidden band width of the emitter layer is wider than that of the base layer. The bipolar transistor further comprises: a composition graded layer formed on the emitter layer and formed of a semiconductor material having the first conductivity type; and an emitter contact layer formed on the composition graded layer and having the first conductivity type. A forbidden band width of said emitter contact layer is narrower than that of the emitter layer and impurity concentration of the emitter contact layer is higher than that of the emitter layer. Composition of the composition graded layer is inclined so as to avoid discontinuity of conduction band or valence band at the interface between the composition graded layer and the emitter layer and at the interface between the composition graded layer and the emitter contact layer, and impurity concentration of the composition graded layer is higher than that of the emitter layer.

According to another aspect of the present invention, there is provided a method of manufacturing a bipolar transistor comprising: providing a semi-insulating substrate; forming a collector contact layer having a first conductivity type on the semi-insulating substrate; forming a collector layer having the first conductivity type on the collector contact layer; forming a base layer having a second conductivity type which is different from the first conductivity type on the collector layer; and forming an emitter layer having the first conductivity type on the base layer. A forbidden band width of the emitter layer is wider than that of the base layer. The method further comprises: forming a composition graded layer made of a semiconductor material which is different from that forming the emitter layer and which has the same conductivity type as the conductivity type of the emitter layer, on the emitter layer; and forming an emitter contact layer having the first conductivity type on the composition graded layer. A forbidden band width of the emitter contact layer is narrower than that of the emitter layer and impurity concentration of the emitter contact layer is higher than that of the emitter layer. The method still further comprises: removing part of the emitter contact layer by etching, and thereby exposing part of the composition graded layer; and etching the exposed part of the composition graded layer to expose part of the emitter layer, by using an etching method in which etching rate of the composition graded layer is higher than that of the emitter layer. Composition of the composition graded layer is inclined so as to avoid discontinuity of conduction band or valence band at the interface between the composition graded layer and the emitter layer and at the interface between the composition graded layer and the emitter contact layer; and impurity concentration of the composition graded layer is higher than that of the emitter layer.

In the heterojunction bipolar transistor according to the present invention, the composition graded layer itself is made to have a high concentration, and thereby it becomes possible to suppress reduction of electron concentration caused by the gradient of electron affinity due to the composition gradient, and to suppress formation of a high resistance portion.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF THE PREFERRED EMBODIMENT

[Embodiments]

With reference to the drawings, embodiments of the present invention will be described in detail.

Figure 1:
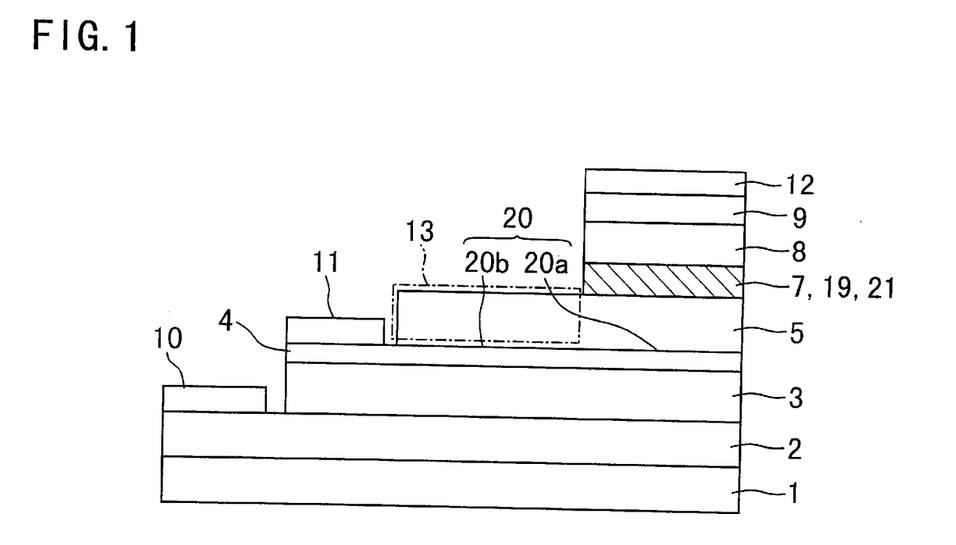
FIG. 1 is a cross sectional view illustrating a layer structure of a heteojunction bipolar transistor according to first, second and third embodiments of the present invention.

FIG. 1 is a sectional view illustrating an epitaxial layer structure of a heterojunction bipolar transistor as a first embodiment of the present invention. In the structure of FIG. 1, n type GaAs subcollector layer 2, n type GaAs collector layer 3, and p type InGaAs composition graded base layer 4 are sequentially formed or laminated on a semi-insulating GaAs substrate 1 which is hereafter referred to also as a semi-insulating substrate. The n type GaAs subcollector layer 2 is hereafter referred to also as an n type collector contact layer, and the n type GaAs collector layer 3 is hereafter referred to also as an n type collector layer. The p type InGaAs composition graded layer 4 is referred to also as a "base layer 4" or a "layer 4" hereafter. On a part of the n type GaAs subcollector layer 2 and on a part of the base layer 4, a collector electrode 10 and a base electrode 11 are respectively formed, for example, by vapor deposition.

On the base layer 4, an n type InGaP emitter layer 5 is formed. Hereafter, the n type InGaP emitter layer 5 is also referred to as an n type emitter layer 5, an emitter layer 5 or a layer 5. On a part of the layer 5, an n+type AlGaAs composition graded layer 7, which is hereafter referred to as a composition graded layer 7, is laminated. The impurity concentration of the layer 5 is set to a low value to avoid increase in the base-emitter capacity, and is set to a value between $1 \times 10^{17}$ cm$^{-3}$ and $5 \times 10^{17}$ cm$^{-3}$.

On the other hand, in this embodiment, impurity concentration of the composition graded layer 7 is set to a relatively high value, for example, $1.5 \times 10^{18}$ cm$^{-3}$. The layer 7 is provided to avoid occurrence of discontinuity of the conduction band between the n type InGaP emitter layer 5 and an n type GaAs cap layer 8, stacked on the layer 6, and thereby to suppress increase in the emitter resistance. Hereafter, the n type GaAs cap layer 8 is also referred to as the "layer 8". An n type composition graded InGaAs contact layer 9 which is stacked on the layer 8 and which is hereafter referred to as "layer 9" is used to decrease contact resistance between an emitter electrode 12 stacked on the layer 9 and the layer 8. Both the layer 8 and the layer 9 are set to have a high impurity concentration equal to or larger than $1 \times 10^{18}$ cm$^{-3}$ to decrease resistance thereof. The layer 8 and the layer 9 function as an n type emitter contact layer.

A hetero guard ring portion 13 is provided to protect the surface of the base layer 4 between the base electrode 11 and the emitter electrode 12. By providing the hetero guard ring portion 13, it becomes possible to greatly decrease the surface recombination current at the surface of the base layer 4. In the present embodiment, the hetero guard ring portion 13 is composed only of the n type InGaP emitter layer 5.

A base area 20, which is formed of a surface layer portion of the p type InGaAs composition graded base layer 4, comprises a first area 20a into which carriers are injected from the n type InGaP emitter layer 5 and a second area 20b into which carriers are not injected from the n type InGaP emitter layer 5. In the present embodiment, the composition graded layer 7 does not exist above the second area 20b, but is formed only above the first area 20a. Therefore, the hetero guard ring portion 13, which is formed by only a part of the emitter layer 5, coats a portion of the second area 20b.

The n+type AlGaAs composition graded layer 7 has a graded distribution of Al composition to avoid discontinuity of conduction band between the n type GaAs cap layer 8 and the n type InGaP emitter layer 5. In the n type InGaP emitter layer 5, the composition distribution is not graded. This is because, if the composition distribution of InGaP is graded, lattice constant of the InGaP deviates largely from that of GaAs and amount of lattice defects becomes large, so that it becomes impossible to obtain crystals having good quality. On the other hand, since lattice constant of AlAs is approximately the same as that of GaAs, even if Al composition is graded in AlGaAs, lattice constant of AlGaAs does not differ largely from that of GaAs. Therefore, it is possible to grow high quality crystal of composition graded AlGaAs having very small lattice defects. Thus, by using the layer 7, it is possible to avoid occurrence of discontinuity of conduction band, even if InGaP in which it is difficult to realize composition graded distribution is used to form the emitter layer 5, i.e., is used as a material for the layer 5.

Figure 2:
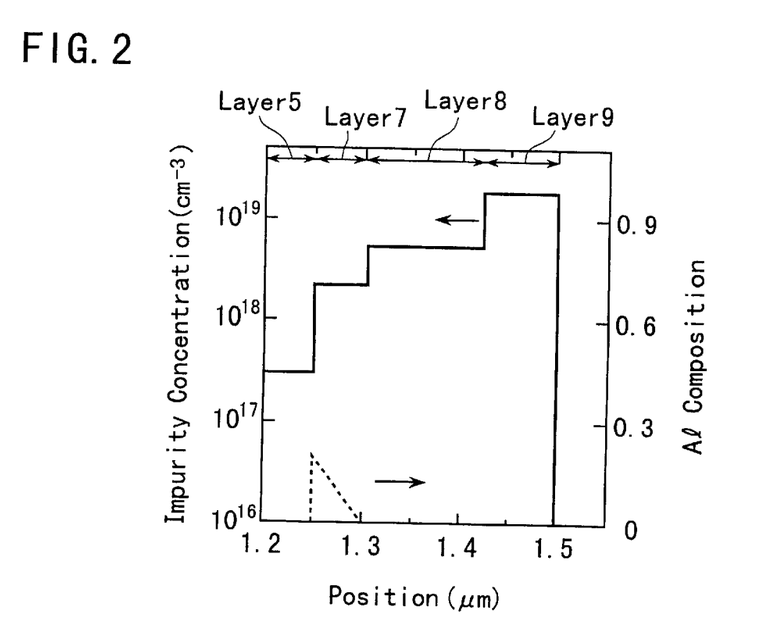
FIG. 2 is a graph showing a distribution of impurity concentration and a distribution of Al composition in the heterojunction bipolar transistor according to the first embodiment of the present invention.

FIG. 2 is a graph showing an example of a distribution of impurity concentration (solid line) and a distribution of Al composition (dotted line), from the layers 5 through 9, near the n+type AlGaAs composition graded layer 7, in the bipolar transistor according to this embodiment.

As shown in FIG. 2, Al composition at a portion within the layer 7 and in contact with the layer 8 is zero, that is, this portion is composed of n+type GaAs. Al composition in the layer 7 increases toward the layer 5, and, at a portion within the layer 7 and in contact with the layer 5, Al composition in AlGaAs is determined such that electron affinity of AlGaAs becomes equal to that of InGaP, i.e., the layer 5. Since electron affinity of the layer 5 and that of the layer 7 coincides with each other at the interface of both layers 5 and 7, a discontinuity of conduction band does not occur. Electron affinity of InGaP which is a material of the layer 5 varies largely depending on a condition of crystal growth, and difference of electron affinity of InGaP with that of GaAs varies from 0.03 eV to 0.22 eV. Therefore, Al composition of AlGaAs at the interface between the layer 7 and the layer 5 is determined within a range from 0.1 to 0.3.

Impurity concentration of the n+type AlGaAs composition graded layer 7 is made higher than that of the layer 5. By such structure, it is possible to compensate for decrease in electron concentration caused by the gradient of electron affinity in the layer 7, and to avoid formation of a high resistance portion. The impurity concentration of the layer 7 is preferably equal to or larger than $1.5 \times 10^{18}$ cm$^{-3}$ considering the difference between electron affinities at both end portions of the layer 7.

FIG. 2 also illustrates a distribution of impurity concentration of the emitter. In this embodiment, impurity concentration of the layer 7 is set to $1.5 \times 10^{18}$ cm$^{-3}$. Impurity concentrations of the layer 8 and the layer 9 are set to $5 \times 10^{18}$ cm$^{-3}$ and $1 \times 10^{19}$ cm$^{-3}$, respectively, and are set to values equal to or larger than $2 \times 10^{18}$ cm$^{-3}$ in order to decrease a sheet resistance of each layer. In case the impurity concentration is set to a value equal to or larger than $2 \times 10^{18}$ cm$^{-3}$, the sum of the sheet resistances of the layers 8 and 9 can be a value equal to or smaller than 1 ohm when the sum of the thicknesses of the layers 8 and 9 is 200 nm and the emitter size is 10 square micrometers, and sufficiently small value of resistance can be obtained.

As mentioned above, the hetero guard ring portion 13 is formed only from the layer 5. The hetero guard ring portion 13 is easily fabricated by performing, after partially etching the layer 9, selective dry etching of InGaP and AlGaAs to etch off only the layer 8 and the layer 7 and to leave the layer 5. In the present structure, since materials are different for the layer 7 and the layer 5, it is possible to easily and distinctively perform selective dry etching.

In the structure according to the present invention, the layer 7 is not usable as a component of the hetero guard ring portion 13, differing from the conventional structure shown in FIG. 9 in which the layer 6 is used as a component of the hetero guard ring portion 13. This is because, in order for the hetero guard ring portion 13 to function only as a protection layer or cap layer of the base layer 4, it is necessary that the hetero guard ring portion 13 is completely depleted. If the layer 7 is also used as a component of the hetero guard ring portion 13, neutral area is produced due to a high impurity concentration of the layer 7, and it becomes impossible to completely deplete the hetero guard ring portion 13.

Figure 3:
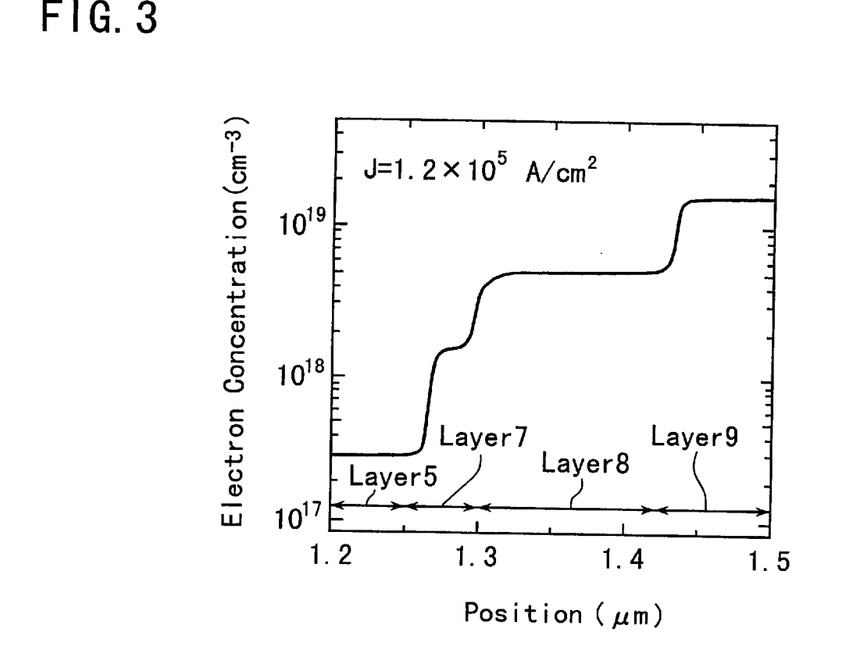
FIG. 3 is a graph showing a distribution of electron concentration in the heterojunction bipolar transistor according to the first embodiment of the present invention.

FIG. 3 is a graph showing a distribution of electron concentration from the layer 5 to the layer 9 of the bipolar transistor according to this embodiment.

Figure 5:
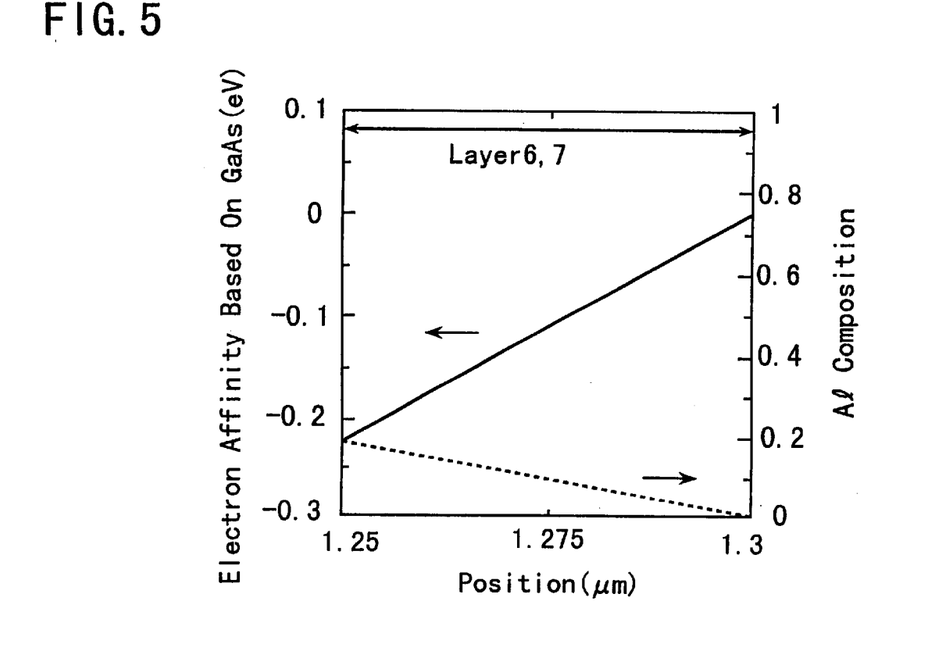
FIG. 5 is a graph showing a distribution of electron affinity and a distribution of Al composition in an AlGaAs composition graded layer of the heterojunction bipolar transistor according to the first embodiment of the present invention.

As apparent from FIG. 3, since the layer 7 is made to have a high impurity concentration, decrease in electron concentration caused by the gradient of electron affinity accompanying the gradient of Al composition in AlGaAs can be effectively suppressed. On the other hand, in the conventional structure shown in FIG. 9, electron concentration largely decreases in the vicinity of the interface between the layer 6 and the layer 5, as apparent from FIG. 12. To explain the reasons for this phenomenon, FIG. 5 shows electron affinity on the basis of GaAs, which is applicable both to the layer 6 of the prior art and to the layer 7 of the present embodiment. In this case, it should be noted that electron affinity of a substance on the basis of GaAs corresponds to the quantity of discontinuity of conduction band when the substance is junctioned with GaAs, and is designated as A Ec. Since conduction band becomes an energy level which is obtained by subtracting the magnitude of electron affinity from vacuum level, the energy level of conduction band becomes high as the electron affinity becomes small. As the energy level of the conduction band becomes higher than the Fermi level, the electron concentration in the conduction band becomes smaller. Therefore, the smaller the electron affinity, the lower the electron concentration. In AlGaAs, electron affinity decreases in accordance with the increase in Al composition. Thus, in the layer 6, electron concentration becomes low on the side of the layer 5 where Al composition becomes high. On the other hand, in the layer 6, electron concentration becomes high on the side of the layer 8 where Al composition becomes low. Consequently, in the layer 6 and on the side of the layer 5, electron concentration becomes considerably lower than the impurity concentration actually doped in the layer 6, due to the relocation of electric charges. When the layer 6 has a distribution of Al composition as shown in FIG. 5, electron concentration decreases by approximately $2 \times 10^{17}$ through $3 \times 10^{17}$ cm$^{-3}$, on the side of the layer 5 in the layer 6. Although phenomenon similar to that occurring in the layer 6 also occurs in the layer 7, the layer 7 is doped at the impurity concentration in the order of $10^{18}$ cm$^{-3}$ which is one order higher when compared with the above-mentioned quantity of decrease of electron concentration ($2$–$3 \times 10^{17}$ cm$^{-3}$) on the side of the layer 5, and, therefore, decrease in electron concentration caused by the decrease in electron affinity is substantially negligible.

Figure 4:
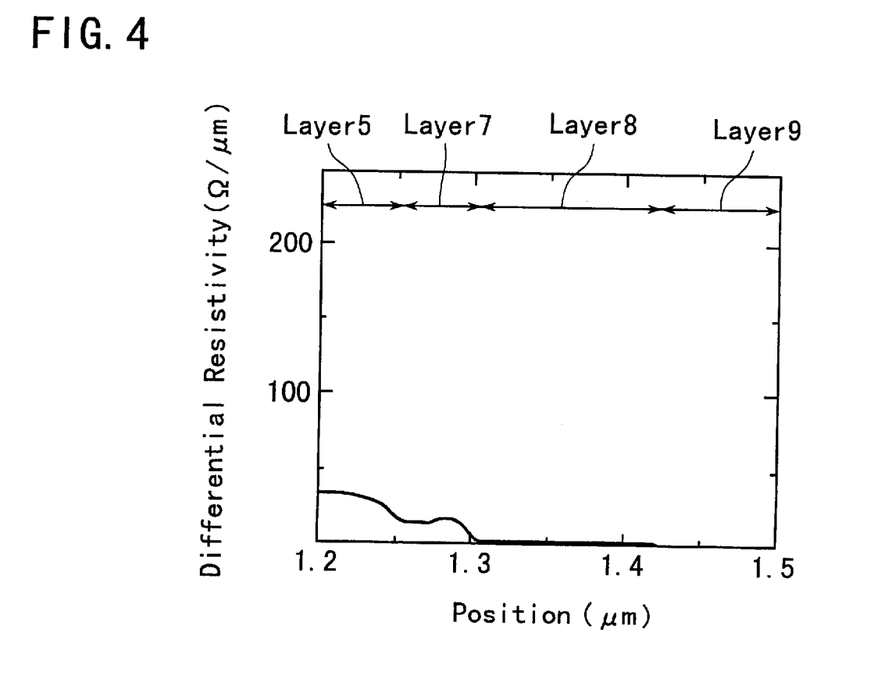
FIG. 4 is a graph showing a distribution of differential resistivity in the heterojunction bipolar transistor according to the first embodiment of the present invention.

FIG. 4 illustrates an example of a distribution of a differential resistivity from the layer 5 to the layer 9 in the bipolar transistor according to this embodiment.

Since the impurity concentration of the layer 7 is set to a value larger than or equal to $1 \times 10^{18}$ cm$^{-3}$, it can be seen from FIG. 4 that high resistance portion is not formed in the vicinity of the interface between the layer 5 and the layer 7. In FIG. 4, the area of a portion surrounded by the curve of the differential resistivity and the abscissa corresponds to the emitter resistance. Therefore, it is apparent that, by using the structure according to the present invention, the emitter resistance can be greatly decreased. When calculated from the area surrounded by the curve of the differential resistivity and the abscissa in each of the graphs of FIG. 4 and FIG. 11, it can be seen that the emitter resistance is decreased from 15 ohm of the conventional structure to 4 ohm of the structure according to the present embodiment, when the emitter area, i.e., emitter size, is 10 square micrometers.

Now, explanation will be made on a bipolar transistor according to a second embodiment. The bipolar transistor according to this embodiment has substantially the same structure as that of the bipolar transistor according to the first embodiment except that, in place of the layer 7 in the structure of FIG. 1, an n+type AlGaAs composition graded layer 19 is used. The layer 19 is not a component of a hetero guard ring portion 13, similarly to the first embodiment in which the layer 7 is not a component of the hetero guard ring portion 13.

Figure 6:
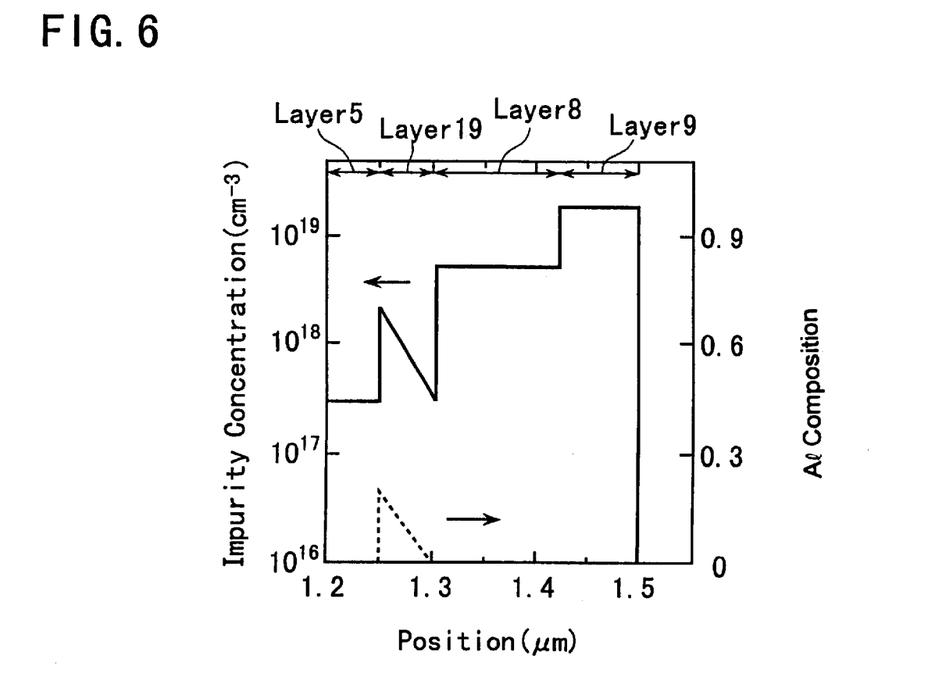
FIG. 6 is a graph showing a distribution of impurity concentration and a distribution of Al composition in the heterojunction bipolar transistor according to the second embodiment of the present invention.

FIG. 6 shows a distribution of Al composition and a distribution of impurity concentration from the layer 5 through the layer 9 in the bipolar transistor according to the second embodiment. As shown in FIG. 6, the n+type AlGaAs composition graded layer 19 has a distribution of graded impurity concentration in which impurity concentration increases toward the layer 5. The impurity concentration within the layer 19 is set to a low value on the order of $10^{17}$ cm$^{-3}$ on the side of the layer 8, and set to a high value equal to or larger than $10^{18}$ cm$^{-3}$ on the side of the layer 5. In this embodiment, since the impurity concentration is determined to be a high value on the side of the layer 5 within the layer 19, emitter resistance is reduced in a manner similar to the first embodiment.

Now, explanation will be made on a bipolar transistor according to a third embodiment. The bipolar transistor according to this embodiment has substantially the same structure as that of the bipolar transistor according to the first embodiment shown in FIG. 1, except that, in place of the layer 7 in the structure of FIG. 1, an n type AlGaAs composition graded layer 21 is used, and except that planar dope is performed at a sheet concentration equal to or larger than $1 \times 10^{12}$ cm$^{-2}$ in the vicinity of the interface between the layer 5 and the layer 21. The layer 21 is not a component of a hetero guard ring portion 13, similarly to the first embodiment in which the layer 7 is not a component of the hetero guard ring portion 13.

Figure 7:
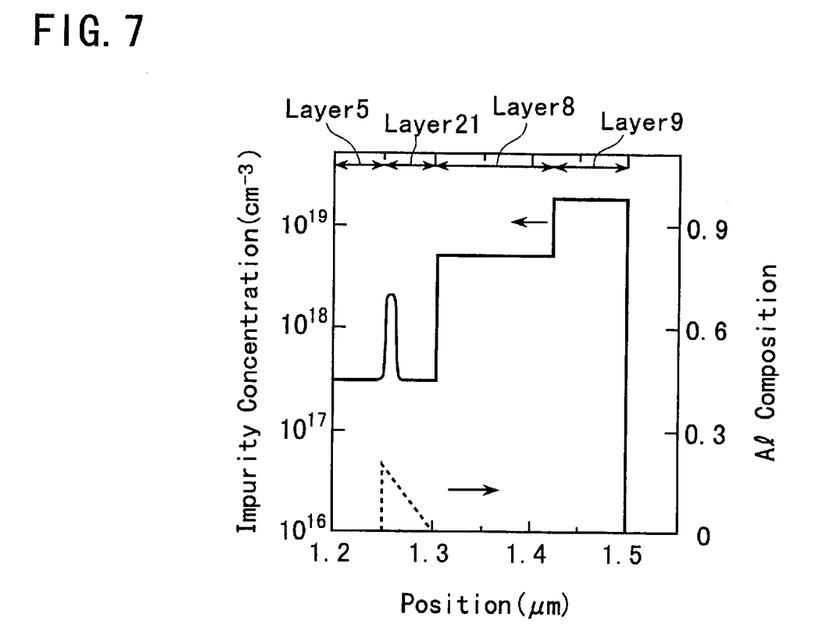
FIG. 7 is a graph showing a distribution of impurity concentration and a distribution of Al composition in the heterojunction bipolar transistor according to the third embodiment of the present invention.

FIG. 7 shows a distribution of Al composition and a distribution of impurity concentration from the layer 5 through the layer 9 in the bipolar transistor according to the third embodiment. As shown in FIG. 7, the layer 21 has generally a relatively low impurity concentration like that of the layer 6 of the conventional device, for example, $3 \times 10^{17}$ cm$^{-3}$, but the impurity concentration of the n type AlGaAs composition graded layer 21 is increased in the vicinity of the interface between the layer 5 and the layer 21 by the planar dope. In this embodiment, although the impurity concentration of the layer 21 is generally low, the impurity concentration near the interface between the layer 5 and the layer 21 is raised, by the planar dope. Therefore, the emitter resistance is reduced in a manner similar to the first embodiment. The planar dope may be performed at the interface between the layer 5 and the layer 21, or may be performed in the vicinity of the interface between the layer 5 and the layer 21 and within the layer 21.

Figure 8:
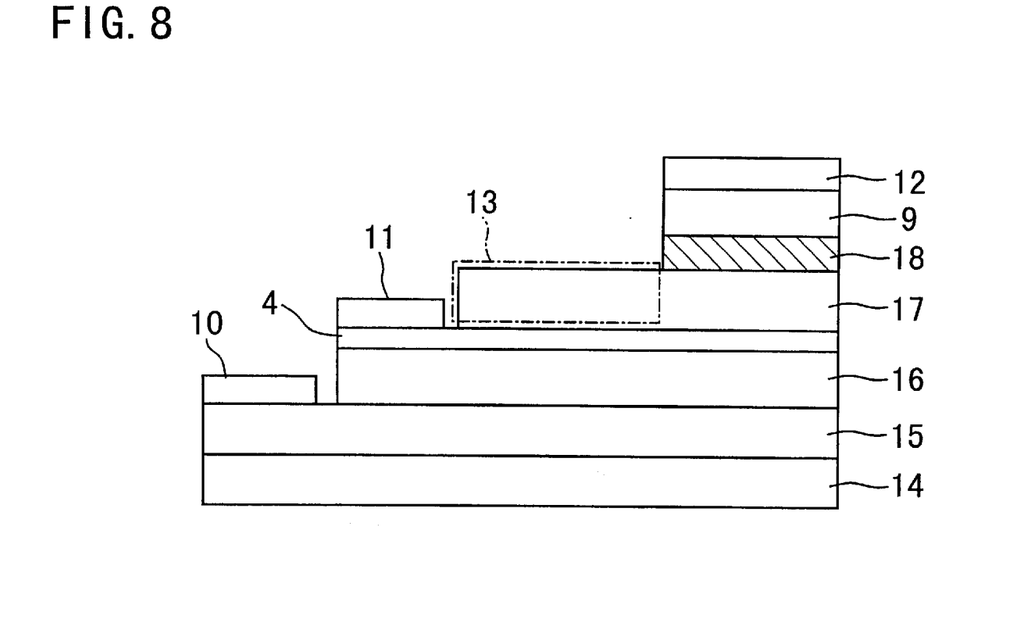
FIG. 8 is a cross sectional view illustrating a layer structure of a heteojunction bipolar transistor according to a fourth embodiment of the present invention.

FIG. 8 is a sectional view illustrating a structure of a bipolar transistor as a fourth embodiment of the present invention. In the fourth embodiment of the present invention, materials of respective layers differ from those of the layers in the bipolar transistor of the first embodiment. Impurity concentrations of the layers of FIG. 8 are similar to those of the corresponding layers of FIG. 1. In the fourth embodiment, a layer corresponding to the n type GaAs cap layer 8 is not provided. In the first embodiment, the epitaxial thin film structure of the HBT is formed on the semi-insulating GaAs substrate 1, while, in this embodiment, the epitaxial thin film structure is formed on a semi-insulating InP substrate 14. In order to match the lattice constant of a subcollector to that of the InP substrate 14, an n type InGaAs subcollector layer 15 is used in place of the n type GaAs subcollector layer 2 of FIG. 1. Similarly, in place of the n type GaAs collector layer 3, the n type InGaP emitter layer 5 and the n+type AlGaAs composition graded layer 7, an n type InP collector layer 16, an n type InP emitter layer 17 and an n+type InAlAs composition graded layer 18 are respectively used. To match lattice constant of each of these layers to that of the InP substrate 14, these layers are formed by using materials different from those of the layers of the first embodiment, but the function of each layer is the same as that of the corresponding layer of the first embodiment. Al composition in the n+type InAlAs composition graded layer 18 is varied such that discontinuity of conduction band does not occur between the n+type InAlAs composition graded layer 18 and the layer 9 contacting therewith and between the n+type InAlAs composition graded layer 18 and the n type InP emitter layer 17 contacting therewith. In this embodiment, the emitter resistance is reduced in a manner similar to the first embodiment.

In the embodiments mentioned above, various modifications on the materials and so on are possible.

For example, in the first embodiment, the emitter layer is constituted as the n type InGaP emitter layer 5. However, material of that layer is not limited only to InGaP, but can be a semiconductor having wide band gap, such as AlGaAs, InAlAs, InGaAsP, InGaAlP, and the like. Also, the base layer is described as the p type InGaAs composition graded layer 4. However, materials of the base layer is not limited to the InGaAs, but can be any semiconductor, such as AlGaAs, GaAs, and the like, as long as it is a p type semiconductor. Further, the collector layer is described as n type GaAs layer in the first embodiment. However, material of the collector layer can be a p type GaAs, or can be a semiconductor other than GaAs.

In the above description of the first through fourth embodiments, examples using n type semiconductors were described. However, it is possible to exchange between n type semiconductors and p type semiconductors. In that case, it is possible, for example, in the structure of FIG. 1, to make the layer 7 have a gradient of composition such that discontinuity of valence band does not occur between the layer 7 and the layer 5 and between the layer 7 and the layer 8.

Also, the present invention can be applied not only to reducing the emitter resistance of a HBT, but also to reducing a resistance of a portion having graded composition.

WORKING EXAMPLES

An explanation of an example of the present invention will now be provided. For example, in the structure shown in FIG. 1, the n type InGaP emitter layer 5 having a thickness of 50 nm, the n+type AlGaAs composition graded layer 7 having a thickness of 50 nm, the n type GaAs layer 8 having a thickness of 120 nm and the n type InGaAs composition graded contact layer 9 having a thickness of 80 nm are sequentially laminated on the p type InGaAs composition graded base layer 4.

If the thickness of the n type InGaP emitter layer 5 is too large, there is a possibility that the hetero guard ring portion 13 is not completely depleted. Therefore, when impurity concentration of the layer 5 is, for example, $3 \times 10^{17}$ cm$^{-3}$, it is preferable that the thickness of the layer 5 is equal to or smaller than 130 nm.

With reference to FIG. 2, consider on avoiding partial decrease in electron concentration caused by the gradient of electron affinity. For this purpose, it is necessary to keep impurity concentration of the layer 7 equal to or larger than $1 \times 10^{18}$ cm$^{-3}$. The decrease in electron concentration occurs near the interface between the layer 7 and the layer 5 in the layer 7. Therefore, in order to avoid formation a high resistance portion caused by the decrease in electron concentration, it is necessary to make impurity concentration high in the vicinity of the interface between the layer 7 and the layer 5.

A distribution of Al composition in the layer 7 is as shown by the dotted line in the graph of FIG. 2. At the interface between the layer 7 and the layer 8, Al composition is zero, and therefore the layer 7 is constituted by GaAs. On the other hand, at the interface between the layer 7 and the layer 5, the Al composition is 0.23, and therefore the layer 7 is constituted by $Al_{0.23}Ga_{0.77}As$.

Electron affinity of InGaP by using GaAs as a reference becomes 0.03 eV when the growth temperature of InGaP is high, and varies to 0.22 eV when the growth temperature is low and crystallizability is not good. Therefore, it is required that the Al composition in the layer 7 at the interface between the layer 7 and the layer 5 is determined such that discontinuity of conduction band does not occur between the layer 5 and the layer 7, within a range from 0.05 to 0.23, depending on the growth condition of the InGaP layer 5. In general, since electron affinity of InGaP by using GaAs as a reference is 0.21 eV, it is preferable that gradient of Al composition in the layer 7 is in the range from 0 to 0.22.

It is sufficient that the layer 7 has the thickness of 50 nm. Even if the thickness of the layer 7 is made larger than 50 nm, the effect of reduction of the emitter resistance does not become prominent. On the other hand, if the thickness of the layer 7 is too thin, discontinuity of conduction band is substantially produced, so that a potential barrier is produced and the emitter resistance becomes high. Therefore, it is necessary that the thickness of the layer 7 is equal to or larger than 1 nm. Also, considering the easiness of fabrication of the Al composition graded layer, it is preferable that the thickness of the layer 7 is equal to or larger than 10 nm. With respect to the layers 8 and 9, impurity concentration of each of these layers is set to a value equal to or larger than $10^{18}$ cm$^{-3}$, from a point of view of decreasing sheet resistance.

Now, explanation will be made on a method for fabricating the hetero guard ring portion 13 in the bipolar transistor according to the present invention.

First, on a semi-insulating GaAs substrate 1, layers 2, 3, 4, 5, 7, 8 and 9 are sequentially formed by using any conventional method, for example, epitaxial growth and so on.

Then, the layer 9 is partially removed by dry etching which uses chlorine gas. Thereafter, the layer 8 and the layer 7 are partially removed by using etchant of sulfuric acid system. The etchant of sulfuric acid system is a mixture of sulfuric acid, hydrogen peroxide and water in the ratio of 1:8:600. Since this etchant can etch GaAs and AlGaAs, but cannot etch InGaP, it is possible to selectively etch until the layer 7 and to leave the layer 5. It is only possible to etch InGaP by using etchant of chlorine system which includes chlorine. Therefore, by using other etchant, for example, etchant of phosphoric acid system which is generally used for etching GaAs, it is also possible to selectively etch until the layer 7 and to leave the layer 5, in a manner similar to the etchant of sulfuric acid system. The etchant of phosphoric acid system is a mixture of phosphoric acid, hydrogen peroxide and water in the ratio of 1:4:90. In this way, by using the etchant which does not include chlorine, it is possible to fabricate the hetero guard ring portion 13 with good controllability. With respect to a collector electrode 10, a base electrode 11 and an emitter electrode 12, these electrodes can also be formed by using any conventional method. However, since formation of these electrodes is not concerned with the essence of the invention, detailed description thereof is omitted here.

FIG. 3 shows a distribution of electron concentration from the layer 5 to the layer 9 of the bipolar transistor according to this example. Calculation of the electron concentration was performed according to the distribution of impurity concentration shown in FIG. 2, by using a two dimensional device simulator. Emitter current was $1.2 \times 10^5$ A/cm$^2$. Impurity concentration of the layer 7 is set to $1.5 \times 10^{18}$ cm$^{-3}$ as shown in FIG. 2, but, as shown in FIG. 3, calculated electron concentration of the layer 7 is on the order of $10^{17}$ cm$^{-3}$ on the side of the layer 5 and is a value equal to or higher than $1.5 \times 10^{18}$ cm$^{-3}$ on the side of the layer 8. Therefore, in the layer 7, a distribution of impurity concentration and a distribution of actual electron concentration do not completely coincide with each other.

On the other hand, FIG. 12 described before shows a distribution of electron concentration of the prior art structure. In the prior art structure, since impurity concentration of the n type AlGaAs composition graded layer 6 is on the order of $10^{17}$ cm$^{-3}$ and low, variation of electron concentration in the layer 6 is more prominent as shown in FIG. 10. That is, electron concentration of the layer 6 decreases prominently on the side of the layer 5, and, on the contrary, increases on the side of the layer 8. Such difference between the distribution of impurity concentration and the distribution of electron concentration in the layer 6 of the prior art structure and in the layer 7 of the structure of the present invention is caused by the variation of electron affinity due to the gradient of Al composition. Since Al compositions of the layer 6 and the layer 7 are inclined approximately similar to each other, distribution or gradients of electron affinity in the layer 6 and the layer 7 are approximately the same.

With reference to FIG. 5 showing a relation between Al composition and electron affinity in the layer 7, electron affinity is relatively large on the side of the layer 8, i.e., on the right side of the graph, and is relatively small on the side of the layer 5, i.e., on the left side of the graph. In the layer 6, there is also a similar relation to that of the layer 7. As electron affinity becomes large, electrons are attracted strongly, and therefore charge transfer occurs in the layer 7. Consequently, in the layer 7, charges are relocated from the side of the layer 5 toward the side of the layer 8, and in the area on the side of the layer 5 within the layer 7, electron concentration becomes smaller than the impurity concentration. In case the gradient of electron affinity exists as shown in FIG. 5, electron concentration on the side of the layer 5 in the layer 7 decreases by $2 \times 10^{17}$ cm$^{-3}$ through $3 \times 10^{17}$ cm$^{-3}$ due to charge transfer. Similar decrease occurs in the layer 6. As a result, in the conventional structure, since impurity concentration in the layer 6 is $3 \times 10^{17}$ cm$^{-3}$, electrons are depleted in the area on the side of the layer 5 in the layer 6, and electron concentration becomes very low. This leads to formation of the high resistance portion. In case of the present invention, impurity concentration of the layer 7 is $10^{18}$ cm$^{-3}$ and is sufficiently high. Therefore, decrease in electron concentration on the side of the layer 5 in the layer 7 caused by the gradient of electron affinity does not give substantial influence on the resultant electron concentration. To this end, a high resistance portion does not appear in the vicinity of the interface between the layer 7 and the layer 5.

With reference to FIG. 4, an explanation will be made on a distribution of differential resistivity r(x) from the layer 5 to the layer 9 in the bipolar transistor according to this example. The resistivity r(x) was obtained as follows. First, quasi-Fermi level of electron was calculated by the two dimensional device simulator. The quasi-Fermi level was, differentiated by a position, and further differentiated by a current, thereby differential resistivity r(x) was derived. The differential resistivity r(x) was integrated from the position of the layer 5 to the position of the layer 9 to obtain emitter resistance Re. A position integral of the differential resistivity r(x) corresponds to a current differential of the difference of the quasi-Fermi levels between both ends of the integration region, that is, a potential difference between both ends of the integration region. Therefore, the integral of the differential resistivity r(x) from the position of the layer 5 to the position of the layer 9 becomes a resistance of a portion from the layer 5 to the layer 9 forming an emitter. Thus, as also apparent from the equation (1) described before, the area of a region surrounded by the curve of the differential resistivity and the abscissa becomes the emitter resistance. Therefore, the smaller the differential resistivity, the smaller the emitter resistance.

As can be seen from FIG. 11, in the conventional structure, electron concentration is very small on the side of the layer 5 within the layer 6 and thus the differential resistivity becomes very large, so that a high resistance portion having very high resistance is formed. On the other hand, as can be seen from FIG. 4, in the structure according to the present invention, the differential resistivity of the layer 7 is relatively small and, therefore, a high resistance portion such as that formed in the conventional structure is not formed. By integrating the differential resistivity of these structures, emitter resistances were obtained. When the emitter area was assumed to be 10 square micrometers, the emitter resistance was 15 ohms in the conventional structure, and 4 ohms in the structure of the present invention. Therefore, it is apparent that, in the structure of the present invention, the emitter resistance is decreased to a value approximately ¼ of that of the prior art structure.

The devices having the structure according to this embodiment and having the prior art structure were actually fabricated by way of trial, and emitter resistances were measured by using an open collector method. As a result, the emitter resistance was 18 ohms in the prior art structure, and 5 ohms in the structure according to the present invention. These values approximately coincide the values obtained by the above-mentioned simulation. Therefore, it has been verified that, by using the structure according to the present invention, the emitter resistance can be greatly decreased.

As mentioned in detail above, according to the present invention, in a bipolar transistor, even if the emitter layer, for example, the n type InGaP emitter layer 5 in FIG. 1, is formed by using a material in which inclination of composition is difficult to perform, it is possible to use a composition graded layer, for example, the n+type AlGaAs composition graded layer 7 in FIG. 1, which is formed by using a material in which inclination of composition is easily performed, so that discontinuity of conduction band can be avoided. Also, by doping the composition graded layer to a high impurity concentration, it is possible to suppress formation of a high resistance portion caused by the variation of electron affinity due to the composition gradient. Thereby, the emitter resistance of a bipolar transistor can be effectively decreased.

Also, according to the present invention, an emitter layer, such as the n type InGaP emitter layer 5 in FIG. 1, and a composition graded layer having high impurity concentration, such as the n+type AlGaAs composition graded layer 7 in FIG. 1, are formed by using mutually different materials. Therefore, selective etching can be easily performed. As a result, it is possible to easily fabricate, by using selective etching, a hetero guard ring portion for protecting the base surface between the emitter electrode and the base electrode.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A bipolar transistor comprising:
   a semi-insulating substrate;
   a collector contact layer formed on said semi-insulating substrate and having a first conductivity type;
   a collector layer formed on said collector contact layer and having said first conductivity type;
   a base layer formed on said collector layer and having a second conductivity type which is different from said first conductivity type;
   an emitter layer formed on said base layer and having said first conductivity type and a forbidden band width wider than that of said base layer;
   a composition graded layer formed on said emitter layer and formed of a semiconductor material having said first conductivity type; and
   an emitter contact layer formed on said composition graded layer and having said first conductivity type and a forbidden band width narrower than that of said emitter layer and having an impurity concentration higher than that of said emitter layer;
   wherein a composition of said composition graded layer is inclined so as to avoid discontinuity of conduction band or valence band at the interface between said composition graded layer and said emitter layer and at the interface between said composition graded layer and said emitter contact layer;
   wherein an impurity concentration of said composition graded layer is higher than that of said emitter layer, and
   wherein said composition graded layer has a distribution of impurity concentration such that the impurity concentration becomes higher toward the side of said emitter layer.

2. A bipolar transistor as set forth in claim 1, wherein said emitter layer comprises InGaP and said composition graded layer comprises AlGaAs.

3. A bipolar transistor as set forth in claim 1, wherein said emitter layer comprises InP and said composition graded layer comprises InAlAs.

4. A bipolar transistor comprising:
   a semi-insulating substrate;
   a collector contact layer formed on said semi-insulating substrate and having a first conductivity type;
   a collector layer formed on said collector contact layer and having said first conductivity type;
   a base layer formed on said collector layer and having a second conductivity type which is different from said first conductivity type;
   an emitter layer formed on said base layer and having said first conductivity type and a forbidden band width wider than that of said base layer;
   a composition graded layer formed on said emitter layer and formed of a semiconductor material having said first conductivity type; and
   an emitter contact layer formed on said composition graded layer and having said first conductivity type and a forbidden band width narrower than that of said emitter layer and having an impurity concentration of said emitter contact layer higher than that of said emitter layer;
   wherein a composition of said composition graded layer is inclined so as to avoid discontinuity of conduction band or valence band at the interface between said composition graded layer and said emitter layer and at the interface between said composition graded layer and said emitter contact layer;
   wherein an impurity concentration of said composition graded layer is higher than that of said emitter layer, and
   wherein impurities are planar doped in said composition graded layer in the vicinity of the interface between said composition graded layer and said emitter layer,
   wherein said emitter layer comprises InP and said composition graded layer comprises InAlAs.

5. A bipolar transistor as set forth in claim 4, wherein impurities are planar doped in said composition graded layer in the vicinity of the interface between said composition graded layer and said emitter layer.

6. A bipolar transistor as set forth in claim 4, wherein said emitter layer comprises InGaP and said composition graded layer comprises AlGaAs.

7. A bipolar transistor as set forth in claim 4, wherein said emitter layer comprises InP and said composition graded layer comprises InAlAs.

8. A bipolar transistor as set forth in claim 4, wherein an impurity concentration in said composition graded layer is about $1.5 \times 10^{18}$ cm$^{-3}$.

9. A bipolar transistor as set forth in claim 4, wherein said composition graded layer suppresses an increase in emitter resistance.

10. A bipolar transistor as set forth in claim 4, wherein an electron affinity of said composition graded layer and an electron affinity of said emitter layer are substantially equal at a composition graded layer/emitter layer interface.

11. A bipolar transistor as set forth in claim 4, wherein an impurity concentration in said emitter layer is in a range of about $1 \times 10^{17}$ cm$^{-3}$ to $5 \times 10^{17}$ cm$^{-3}$.

12. A bipolar transistor comprising:

a collector contact layer formed on a semi-insulating substrate and having a first conductivity type;

a collector layer formed on said collector contact layer and having said first conductivity type;

a base layer formed on said collector layer and having a second conductivity type which is different from said first conductivity type;

an emitter layer formed on said base layer and having said first conductivity type;

a composition graded layer formed on said emitter layer and having said first conductivity type; and an emitter contact layer formed on said composition graded layer and having said first conductivity type and a forbidden band width narrower than that of said emitter layer and having an impurity concentration higher than that of said emitter layer;

wherein an impurity concentration in said composition graded layer gradually increases from an upper surface near said emitter contact layer to a lower surface near said emitter layer, and wherein said composition graded layer inhibits a discontinuity of conduction band and valence band at an interface between said composition graded layer and said emitter layer and at the interface between said composition graded layer and said emitter contact layer.

* * * * *